United States Patent
Chu Ke et al.

(10) Patent No.: US 9,547,204 B2
(45) Date of Patent: Jan. 17, 2017

(54) PIXEL MATRIX AND DISPLAY USING THE SAME

(71) Applicant: AU Optronics Corporation, Hsin-Chu (TW)

(72) Inventors: Hui Chu Ke, Hsin-Chu (TW); Sheng-Wen Cheng, Hsin-Chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 41 days.

(21) Appl. No.: 14/504,900

(22) Filed: Oct. 2, 2014

(65) Prior Publication Data
US 2015/0355492 A1 Dec. 10, 2015

(30) Foreign Application Priority Data
Jun. 5, 2014 (TW) .............................. 103119587 A

(51) Int. Cl.
| | | |
|---|---|---|
| G02F 1/1343 | (2006.01) | |
| G02F 1/1335 | (2006.01) | |
| H01L 27/12 | (2006.01) | |
| G06F 1/16 | (2006.01) | |
| G02F 1/1362 | (2006.01) | |
| G02F 1/1368 | (2006.01) | |

(52) U.S. Cl.
CPC ......... *G02F 1/13439* (2013.01); *G02F 1/1368* (2013.01); *G02F 1/133555* (2013.01); *G02F 1/134309* (2013.01); *G02F 1/136286* (2013.01); *G06F 1/163* (2013.01); *H01L 27/1214* (2013.01); *G02F 2201/52* (2013.01)

(58) Field of Classification Search
CPC ............ G02F 1/13439; G02F 1/136286; G02F 1/1368; G02F 1/163; H01L 27/1214
See application file for complete search history.

(56) References Cited

U.S. PATENT DOCUMENTS

| | | | |
|---|---|---|---|
| 7,636,076 B2 | 12/2009 | Hung et al. | |
| 8,552,944 B2 | 10/2013 | Pei et al. | |
| 2005/0094059 A1* | 5/2005 | Noguchi | C09K 19/32 349/106 |
| 2006/0125983 A1* | 6/2006 | Hu | G02F 1/133514 349/114 |
| 2007/0164953 A1* | 7/2007 | Huang | G02F 1/133514 345/88 |

(Continued)

FOREIGN PATENT DOCUMENTS

| | | |
|---|---|---|
| CN | 101051228 | 10/2007 |
| CN | 101573652 | 11/2009 |

(Continued)

*Primary Examiner* — Claire X Pappas
*Assistant Examiner* — Robert Stone
(74) *Attorney, Agent, or Firm* — WPAT, PC; Justin King

(57) ABSTRACT

A pixel matrix includes pixel units. The pixel units are arranged in a repeating pattern, in which each of the pixel units includes transparent pixels, reflective pixels, and switch components. Each of the transparent pixels includes a transparent electrode and a transparent color resist layer disposed on the transparent electrode. Each of the reflective pixels includes a reflective electrode. The switch components are connected to the transparent electrodes of the transparent pixels and the reflective electrodes of the reflective pixels respectively for driving the transparent pixels and the reflective pixels individually.

5 Claims, 13 Drawing Sheets

(56) References Cited

U.S. PATENT DOCUMENTS

| | | | |
|---|---|---|---|
| 2008/0123000 A1* | 5/2008 | Lin | G02F 1/133555 349/33 |
| 2008/0123033 A1 | 5/2008 | Grip et al. | |
| 2008/0180606 A1* | 7/2008 | Chang | G02F 1/133555 349/96 |
| 2009/0315880 A1* | 12/2009 | Cho | G02F 1/13624 345/214 |
| 2010/0231614 A1* | 9/2010 | Vieri | G09G 3/3677 345/690 |

FOREIGN PATENT DOCUMENTS

| | | |
|---|---|---|
| TW | 200823522 | 6/2008 |
| TW | 200832305 | 8/2008 |

\* cited by examiner

PIXEL MATRIX AND DISPLAY USING THE SAME

RELATED APPLICATIONS

This application claims priority to Taiwan Application Serial Number 103119587, filed Jun. 5, 2014, which is herein incorporated by reference.

BACKGROUND

Field of Invention

The present invention relates to a pixel matrix of a liquid crystal display. More particularly, the present invention relates to a pixel matrix of a transflective liquid crystal display.

Description of Related Art

Wearable displays are becoming increasingly popular. Wearable displays are applied to watches and glasses. Information can be obtained from such products regardless where a user is. Therefore, wearable displays need to provide a clear image with a high level of visibility under high illumination environments, and must also consume lower electricity.

The brightness of a typical display is limited by the brightness of a backlight, and the brightness of the backlight can't be raised without limited. This is due to the material restrictions, as well as the fact that an excessive brightness will generate too much heat and result in a great consumption of energy. Assuming it is desired to control temperature and minimize electricity consumption, a clear image cannot be obtained under high ambient light or outdoor environments. Hence, a reflective display is suitable for the high ambient light and outdoor environments. Though the reflective display can display a clear image under high ambient light or outdoor environments, the reflective display cannot display a clear image under low ambient light environments.

SUMMARY

An aspect of the present invention provides a pixel matrix with a transflective pixel design, such that a display image is provided effectively regardless of whether the ambient light is high or low. In addition, an aspect of the present invention provides a display applying such a pixel matrix, such that a user wearing the display can clearly see information on the display screen regardless of whether indoors or outdoors.

An aspect of the present invention provides a pixel matrix, and the pixel matrix includes pixel units. The pixel units are arranged in a repeating pattern, in which each of the pixel units includes transparent pixels, reflective pixels, and switch components. Each of the transparent pixels includes a transparent electrode and a transparent color resist layer disposed on the transparent electrode. Each of the reflective pixels includes a reflective electrode. The switch components are connected to the transparent electrodes of the transparent pixels and the reflective electrodes of the reflective pixels respectively for driving the transparent pixels and the reflective pixels individually.

In one or more embodiments, the transparent electrodes have a first operating voltage, and the reflective electrodes have a second operating voltage which is different from the first operating voltage.

In one or more embodiments, each of the pixel units includes a first row area and a second row area disposed in a side-by-side arrangement. A first transparent pixel, a second transparent pixel, a first reflective pixel, a third transparent pixel, a fourth transparent pixel, and a second reflective pixel are arranged in sequence from a left side to a right side in the first row area. A fifth transparent pixel, a sixth transparent pixel, a third reflective pixel, a seventh transparent pixel, an eighth transparent pixel, and a fourth reflective pixel are arranged in sequence from a left side to a right side in the second row area.

In one or more embodiments, a width of each of the reflective pixels is twice a width of each of the transparent pixels.

In one or more embodiments, each of the pixel units includes a first row area and a second row area disposed in a side-by-side arrangement. A first transparent pixel, a second transparent pixel, a third transparent pixel, and a first reflective pixel are arranged in sequence from a left side to a right side in the first row area. A second reflective pixel, a fourth transparent pixel, a fifth transparent pixel, and a sixth transparent pixel are arranged in sequence from a left side to a right side in the second row area.

In one or more embodiments, each of the pixel units includes a first row area and a second row area disposed in a side-by-side arrangement. A first transparent pixel, a second transparent pixel, and a first reflective pixel are arranged in sequence from a left side to a right side in the first row area. A second reflective pixel, a third transparent pixel, and a fourth transparent pixel are arranged in sequence from a left side to a right side in the second row area.

In one or more embodiments, the pixel matrix further includes reflective color resist layers disposed respectively on the reflective pixels.

In one or more embodiments, each of the pixel units includes a first row area and a second row area disposed in a side-by-side arrangement. A first transparent pixel, a second transparent pixel, a first reflective pixel, a second reflective pixel, a third transparent pixel, a fourth transparent pixel, a third reflective pixel. A fourth reflective pixel are arranged in sequence from a left side to a right side in the first row area, and a fifth transparent pixel, a sixth transparent pixel, a fifth reflective pixel, a sixth reflective pixel, a seventh transparent pixel, an eighth transparent pixel, a seventh reflective pixel, and an eighth reflective pixel are arranged in sequence from a left side to a right side in the second row area.

In one or more embodiments, each of the pixel units includes a first row area and a second row area disposed in a side-by-side arrangement. A first transparent pixel, a second transparent pixel, a third transparent pixel, a first reflective pixel, a second reflective pixel, and a third reflective pixel are arranged in sequence from a left side to a right side in the first row area. A fourth reflective pixel, a fifth reflective pixel, a sixth reflective pixel, a fourth transparent pixel, a fifth transparent pixel, and a sixth transparent pixel are arranged in sequence from a left side to a right side in the second row area.

In one or more embodiments, each of the pixel units includes a first row area and a second row area disposed in a side-by-side arrangement. A first transparent pixel, a second transparent pixel, a first reflective pixel, and a second reflective pixel are arranged in sequence from a left side to a right side in the first row area. A third reflective pixel, a fourth reflective pixel, a third transparent pixel, and a fourth transparent pixel are arranged in sequence from a left side to a right side in the second row area.

In one or more embodiments, an image signal of the pixel matrix includes a color signal and a gray signal. The color signal includes a red signal, a green signal, and a blue signal, in which the gray signal is defined by dividing a superimposition of the red signal, the green signal, and the blue signal by three.

An aspect of the present invention provides a display including a first area, a second area, first main pixels, and second main pixels. The first area and the second area are disposed side by side. The first main pixels are disposed in the first area in a repeating pattern. The second main pixels are disposed in the second area in a repeating pattern, and each of the second main pixels includes a first row area and a second row area. A first transparent pixel, a second transparent pixel, a first reflective pixel, a third transparent pixel, a fourth transparent pixel, and a second reflective pixel are arranged in sequence from a left side to a right side in the first row area. A fifth transparent pixel, a sixth transparent pixel, a third reflective pixel, a seventh transparent pixel, an eighth transparent pixel, and a fourth reflective pixel are arranged in sequence from a left side to a right side in the second row area. Each of the transparent pixels includes a transparent electrode and a transparent color resist layer disposed on the transparent electrode.

In one or more embodiments, each of the second main pixels includes a fifth reflective pixel, a sixth reflective pixel, a seventh reflective pixel, an eighth reflective pixel, and reflective color resist layers. The fifth reflective pixel is disposed in the first row area, and the fifth reflective pixel is located between the first reflective pixel and the third transparent pixel. The sixth reflective pixel is disposed in the first row area, and the sixth reflective pixel is located at a side of the second reflective pixel and opposite the fourth transparent pixel. The seventh reflective pixel is disposed in the second row area, and the seventh reflective pixel is located between the third reflective pixel and the seventh transparent pixel. The eighth reflective pixel is disposed in the second row area, and the eighth reflective pixel is located at a side of the fourth reflective pixel and opposite the eighth transparent pixel. The reflective color resist layers are disposed respectively on the reflective pixels.

In one or more embodiments, each of the second main pixels further includes switch components connected to the transparent electrodes of the transparent pixels and the reflective electrodes of the reflective pixels respectively for driving the transparent pixels and the reflective pixels individually.

In one or more embodiments, a ratio of the first area to the second area is between about 1 and 15.

An aspect of the present invention provides a pixel matrix with a transflective pixel design. When a user uses a display with the pixel matrix indoors, the pixel matrix provides an image mainly through the transparent pixels. When the user uses the display with the pixel matrix outdoors, the pixel matrix provides an image mainly through the reflective pixels. In addition to displaying information clearly, energy consumption is reduced by the transflective pixel design.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
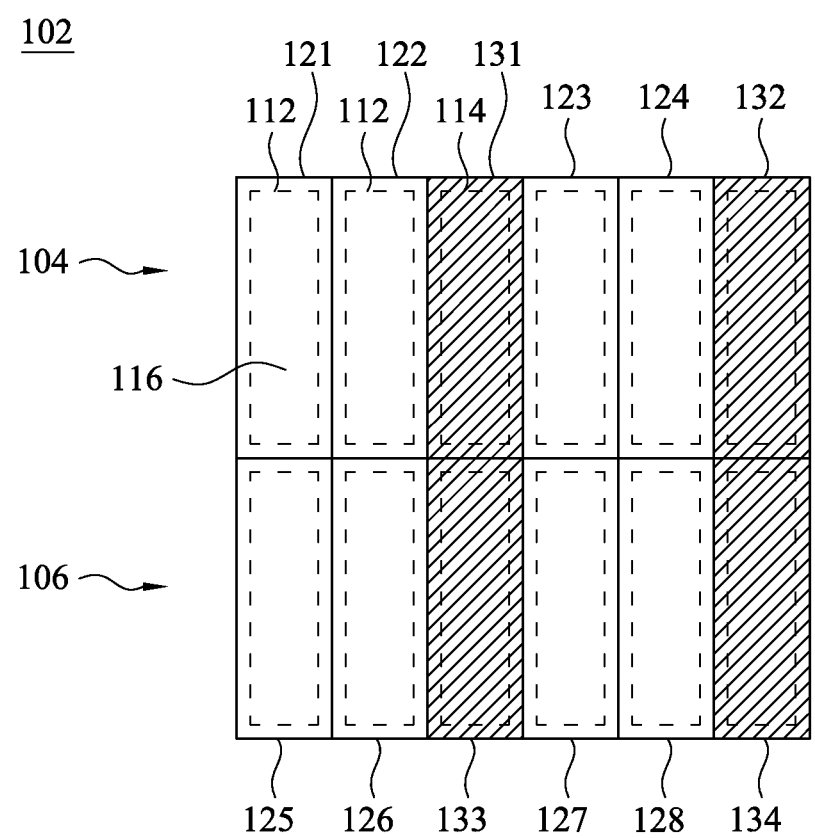
FIG. 1 is a top view of a pixel unit of a pixel matrix according to a first embodiment of the present invention.

Reference will now be made in detail to the present embodiments of the invention, examples of which are illustrated in the accompanying drawings. Wherever possible, the same reference numbers are used in the drawings and the description to refer to the same or like parts.

Because a conventional wearable display with either transparent pixels or reflective pixels cannot deal with both high and low ambient light environments, a low visibility problem occurs with transparent pixels under high ambient light environment or with reflective pixels under low ambient light environment. Moreover, a transparent area and a reflective area cannot be controlled individually in transflective pixels. Therefore, the colors of two such areas are affected by each other, such that an accurate full-color cannot be realized.

An aspect of the present invention provides a pixel matrix with a transflective pixel design, in which transparent pixels and reflective pixels are controlled individually. When the transflective pixel design is applied to a wearable display, electricity consumption is reduced, and great visibility is achieved, regardless of whether indoors or outdoors.

FIG. 1 is a top view of a pixel unit of a pixel matrix according to a first embodiment of the present invention. A pixel unit 102 includes a first row area 104 and a second row area 106 disposed in a side-by-side arrangement.

According to an embodiment of the present embodiment, in an arrangement of the first row area 104, a first transparent pixel 121, a second transparent pixel 122, a first reflective pixel 131, a third transparent pixel 123, a fourth transparent pixel 124, and a second reflective pixel 132 are arranged in sequence from a left side to a right side in the first row area 104. In an arrangement of the second row area 106, a fifth transparent pixel 125, a sixth transparent pixel 126, a third reflective pixel 133, a seventh transparent pixel 127, an eighth transparent pixel 128, and a fourth reflective pixel 134 are arranged in sequence from a left side to a right side in the second row area 106.

Each of the above transparent pixels includes a transparent electrode 112 and a transparent color resist layer 116 disposed on the transparent electrode 112. The transparent electrode 112 is used for determining whether the transparent pixel works. In other words, the transparent electrode 112 is used for determining whether light transmits through the transparent pixel. Once light transmits through the transparent pixel, the transparent color resist layer 116 determines the color of the transparent pixel.

Therefore, in order to correspond to the transmission of the light, the transparent electrode 112 is made of a transparent conductive oxide (TCO), such as indium tin oxide, zinc oxide, aluminum doped zinc oxide, gallium doped zinc oxide, indium doped zinc oxide, or another transparent conductive material.

Each of the above reflective pixels includes a reflective electrode 114. The reflective electrode 114 is used for determining whether the reflective pixel works. In other words, the reflective electrode 114 is used for determining whether light is reflected from the reflective pixel.

Therefore, in order to enable the reflection of light, the reflective electrode 114 is made of gold, copper, nickel, silver, zinc, chromium, tin, aluminum or metal combinations thereof.

In addition, each of the transparent pixels and the reflective pixels respectively includes a corresponding switch component (not shown). The switch components are respectively connected to the transparent electrodes 112 of the transparent pixels and the reflective electrodes 114 of the reflective pixels for individually driving the transparent pixels and the reflective pixels.

In other words, the pixel unit 102 of the present invention includes the switch components individually driving the transparent pixels and the reflective pixels. With the switch components, the pixel unit 102 can display through either the transparent pixels or reflective pixels. Similarly, the pixel unit 102 also can display through both of the transparent pixels and the reflective pixels.

According to an embodiment of the present invention, a voltage is inputted to each of the transparent electrodes 112 during operation, such that each of the transparent electrodes 112 has a first operating voltage. In addition, another voltage is inputted to each of the reflective electrodes 114, such that each of the reflective electrodes 114 has a second operating voltage. The first operating voltage and the second operating voltage are different, such that the transparent pixels and the reflective pixels can be driven individually.

Figure 2:
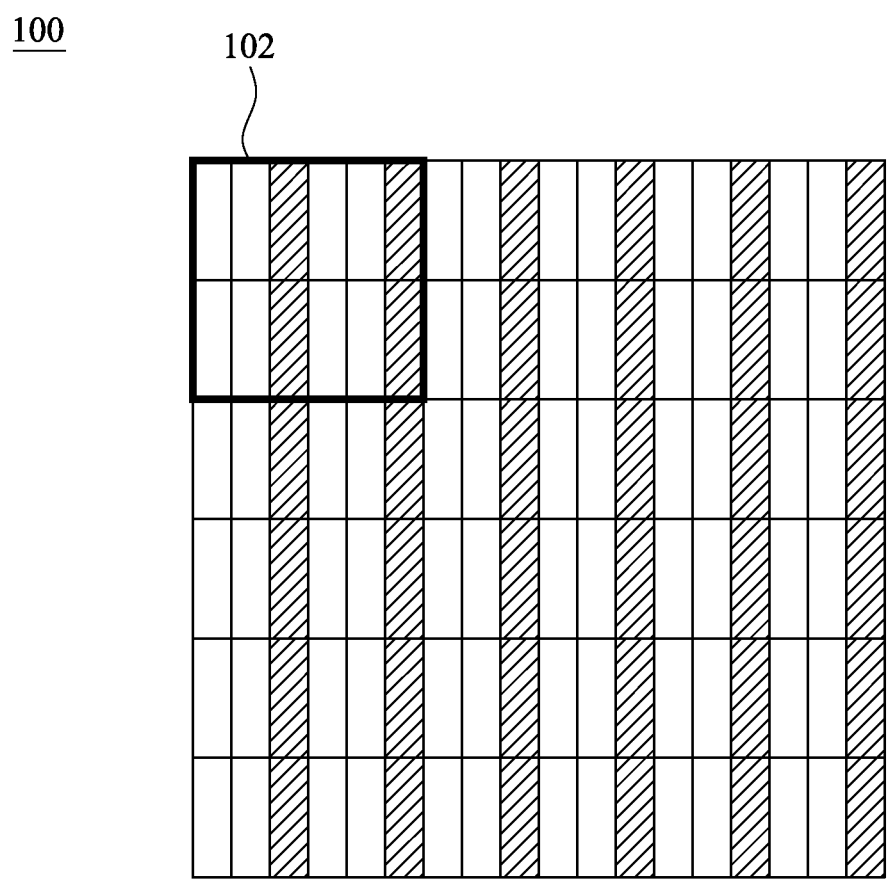
FIG. 2 is a top view of a pixel matrix according to an embodiment of the present invention.

FIG. 2 is a top view of a pixel matrix according to an embodiment of the present invention. A pixel matrix 100 of the present invention is formed through arranging pixel units 102, in which the pixel units 102 are arranged in a repeating pattern. The pixel units 102 of the pixel matrix 100 of the present invention in FIG. 2 are the pixel units 102 of the first example, in which an area within the black box is one of the pixel units 102. The pixel units 102 are arranged side by side to complete the arrangement in a repeating pattern and form the pixel matrix 100.

Figure 3:
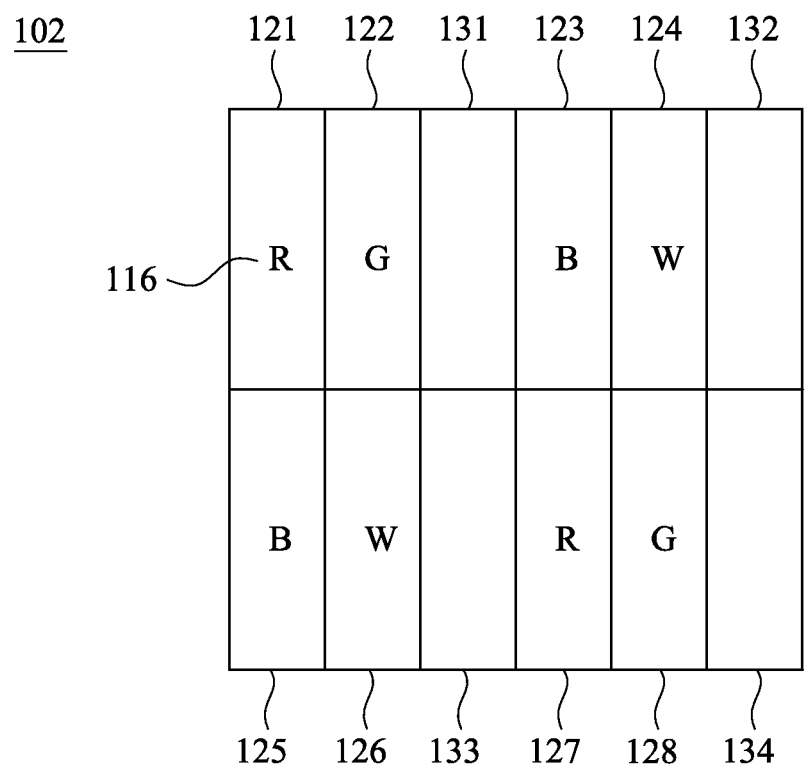
FIG. 3 is a top view of an arrangement of the pixel unit in FIG. 1 according to an embodiment.

FIG. 3 is a top view of an arrangement of the pixel unit in FIG. 1 according to an embodiment. According to the above description, when light transmits through one the transparent pixels, the transparent color resist layer 116 determines the color of the transparent pixel.

According to an embodiment of the present invention, using different colors of the transparent color resist layers 116, the first transparent pixel 121 is red R, the second transparent pixel 122 is green G, the third transparent pixel 123 is blue B, the fourth transparent pixel 124 is white W, the fifth transparent pixel 125 is blue B, the sixth transparent pixel 126 is white W, the seventh transparent pixel 127 is red R, and the eighth transparent pixel 128 is green G.

In addition, the first reflective pixel 131, the second reflective pixel 132, the third reflective pixel 133, and the fourth reflective pixel 134 directly reflect ambient light.

In the present invention, when the pixel unit 102 is applied indoors under a condition of low ambient light, the transparent pixels of the pixel unit 102 are respectively driven by the switch components, such that the pixel matrix (see FIG. 2) formed by the pixel units 102 provides a full-color display image.

When the pixel unit 102 is applied outdoors under a condition of high ambient light, the reflective pixels of the pixel unit 102 are respectively driven by the switch components. Because no color resist layer is disposed on the reflective pixels, the reflective pixels are used for reflecting ambient light. Therefore, the pixel matrix (see FIG. 2) formed by the pixel units 102 provides a black-and-white (B/W) display image.

However, a person having ordinary skill in the art may choose suitable environments for individually driving the transparent pixels and the reflective pixels. For example, under some environments, the transparent pixels and the reflective pixels can be driven at the same time.

Since each of the transparent pixels and the reflective pixels of the pixel units 102 of the pixel matrix of the present invention is individually driven, the colors of different areas (transparent pixels and the reflective pixels) are not affected by each other in the different environments (indoor or outdoor use).

In the present embodiment, since the pixel unit 102 includes the transparent color resist layers 116 with different colors, the pixel unit 102 can display a full-color display image. However, a person having ordinary skill in the art may choose a suitable arrangement of the transparent color resist layers 116 with different colors as required. For example, the first transparent pixel 121 and the fifth transparent pixel 125 may be red R, the second transparent pixel 122 and the sixth transparent pixel 126 may be green G, the third transparent pixel 123 and the seventh transparent pixel 127 may be blue B, and the fourth transparent pixel 124 and the eighth transparent pixel 128 may be red R.

Figure 4:
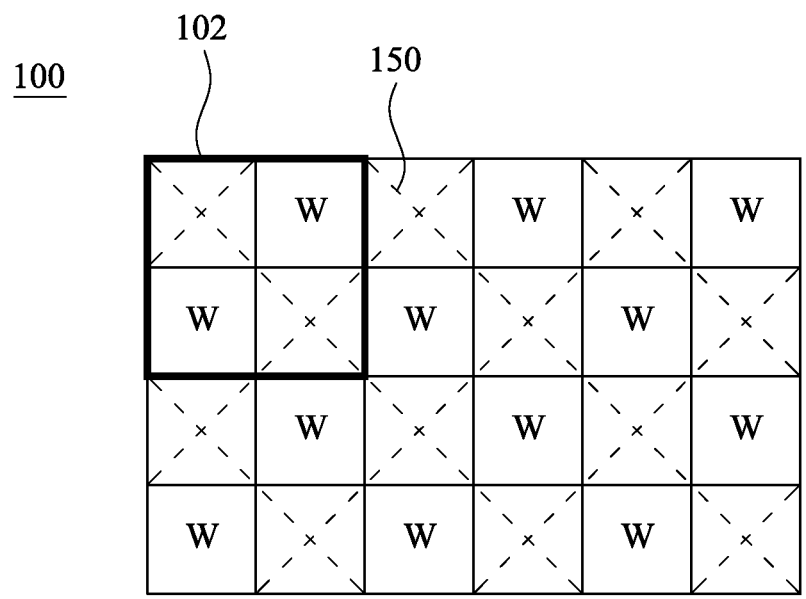
FIG. 4 is a top view of sampling the pixel units in FIG. 3 according to an embodiment.
Figure 5:
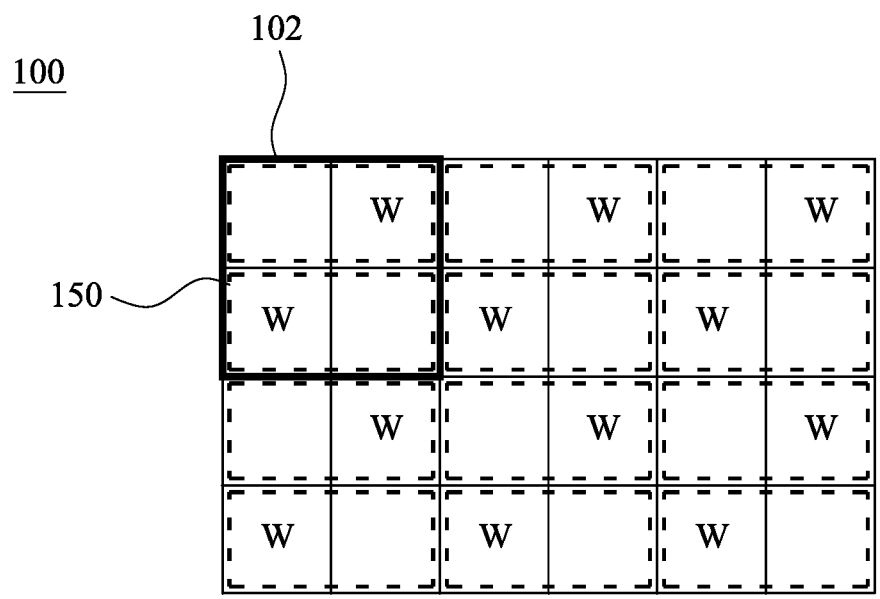
FIG. 5 is a top view of sampling the pixel units in FIG. 3 according to another embodiment.

FIG. 4 is a top view of sampling the pixel units in FIG. 3 according to an embodiment. FIG. 5 is a top view of sampling the pixel units in FIG. 3 according to another embodiment. The pixel matrixes 100 in FIG. 4 and FIG. 5 have the same color arrangement, and the color arrangement is that of the pixel unit 102 in FIG. 3. According to FIG. 4 and FIG. 5, in addition to individually driving the transparent pixels and the reflective pixels, the pixel matrix 100 of the present invention utilizes a method for sampling the pixels through sub-pixel-rendering (SPR) such that not only is an opening rate of the pixels increased but image resolution is maintained.

A target pixel W is a white pixel. When the pixel matrix 100 needs to provide a white color, each of sampling areas 150 includes the target pixel W, in which each of the sampling areas 150 can be arranged in a repeating pattern.

As an example, the sampling areas 150 in FIG. 4 are diamond-shaped, and the diamond sampling areas 150 can be arranged in a repeating pattern. In addition, each of the sampling areas 150 has one target pixel W inside.

As another example, the sampling areas 150 in FIG. 5 are rectangular, and the rectangular sampling areas 150 can be arranged in a repeating pattern. Similarly, each of the sampling areas 150 has one target pixel W inside.

The sampling areas 150 in the present embodiment can be arranged in a repeating pattern, and each of the sampling areas 150 needs to have one target pixel inside. However, a person having ordinary skill in the art may choose a suitable shape of the sampling areas 150 as required.

In addition, the pixel matrix 100 of the present invention can provide the display image through the reflective pixels. The display image provided by the reflective pixels is black-and-white (B/W) with reflecting ambient light, instead of a full-color display image. The pixel matrix 100 includes an image signal having a color signal and a gray signal for determining the image type. Therefore, when the pixel matrix 100 needs to provide a display image through the reflective pixels when an input source is the color signal including a red signal, a green signal, and a blue signal, the gray signal is defined by dividing a superimposition of the red signal, the green signal, and the blue signal by three.

The transparent pixels and the reflective pixels of the pixel unit 102 of the pixel matrix 100 of the present invention individually driven by the corresponding switch components are described in the above embodiments. In the following embodiments, descriptions are provided with respect to variations of the arrangement of the transparent pixels and the reflective pixels of the pixel unit 102, and aspects of the above embodiments that are the same are not described again.

Figure 6:
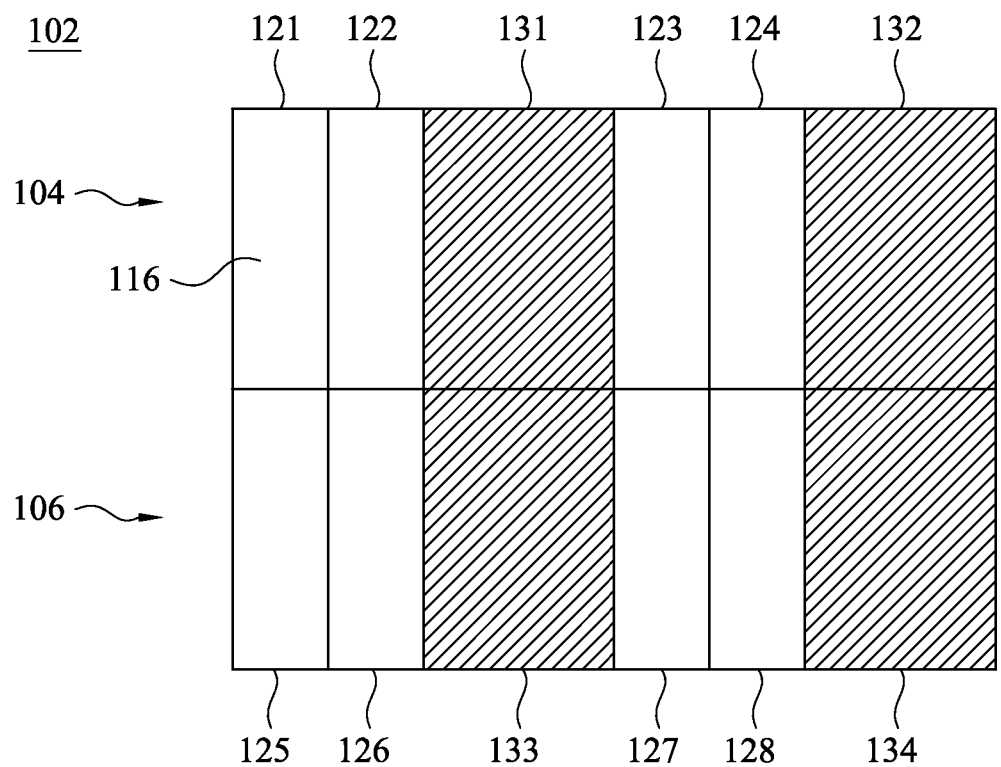
FIG. 6 is a top view of a pixel unit of a pixel matrix according to a second embodiment of the present invention.

FIG. 6 is a top view of a pixel unit of a pixel matrix according to a second embodiment of the present invention. A pixel unit 102 includes a first row area 104 and a second row area 106 disposed in a side-by-side arrangement.

In an arrangement of the first row area 104, a first transparent pixel 121, a second transparent pixel 122, a first reflective pixel 131, a third transparent pixel 123, a fourth transparent pixel 124, and a second reflective pixel 132 are arranged in sequence from a left side to a right side in the first row area 104. A width of each of the reflective pixels is twice a width of each of the transparent pixels, and transparent color resist layers 116 are disposed respectively on the transparent pixels.

In an arrangement of the second row area 106, a fifth transparent pixel 125, a sixth transparent pixel 126, a third reflective pixel 133, a seventh transparent pixel 127, an eighth transparent pixel 128, and a fourth reflective pixel 134 are arranged in sequence from a left side to a right side in the second row area 106. A width of each of the reflective pixels is twice a width of each of the transparent pixels, and the transparent color resist layers 116 are disposed respectively on the transparent pixels.

The area of the reflective pixels of the present embodiment is increased, such that brightness of the display image provided by the reflective pixels is greater than in the first embodiment when the pixel unit 102 is used outdoors or otherwise under a condition of high ambient light.

Figure 7:
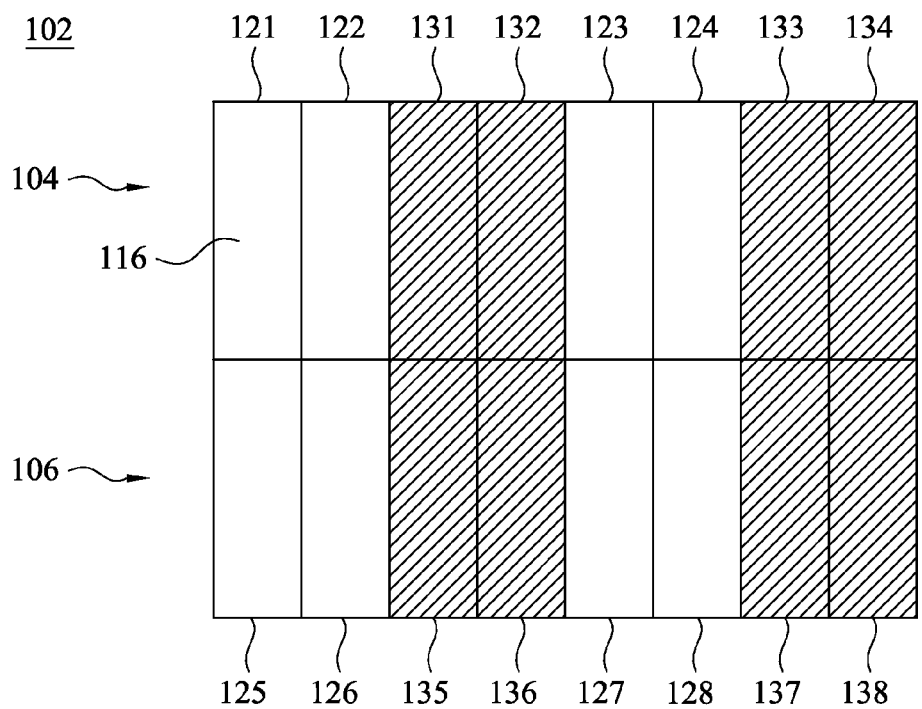
FIG. 7 is a top view of a pixel unit of a pixel matrix according to a third embodiment of the present invention.

FIG. 7 is a top view of a pixel unit of a pixel matrix according to a third embodiment of the present invention. A pixel unit 102 includes a first row area 104 and a second row area 106 disposed in a side-by-side arrangement.

In an arrangement of the first row area 104, a first transparent pixel 121, a second transparent pixel 122, a first reflective pixel 131, a second reflective pixel 132, a third transparent pixel 123, a fourth transparent pixel 124, a third reflective pixel 133, and a fourth reflective pixel 134 are arranged in sequence from a left side to a right side in the first row area 104.

In an arrangement of the second row area 106, a fifth transparent pixel 125, a sixth transparent pixel 126, a fifth reflective pixel 135, a sixth reflective pixel 136, a seventh transparent pixel 127, an eighth transparent pixel 128, a seventh reflective pixel 137, and an eighth reflective 138 pixel are arranged in sequence from a left side to a right side in the second row area 106.

In the present embodiment, the transparent pixels are approximately the same as the transparent pixels of the second embodiment, and hence the transparent pixels include the transparent color resist layers 116. The reflective pixels of the present embodiment are defined by dividing the reflective pixels of the second embodiment into two parts, such that the arrangements of the reflective pixels and the transparent pixels are the same. Under such an arrangement, reflective color resist layers are disposed respectively on the reflective pixels, in which the reflective color resist layers are similar to the transparent color resist layer 116. Therefore, the reflective pixels of the pixel unit 102 provide a full-color display image, and further display applications of the pixel matrix 100 of the present invention are possible. An actual application is described below.

Figure 8:
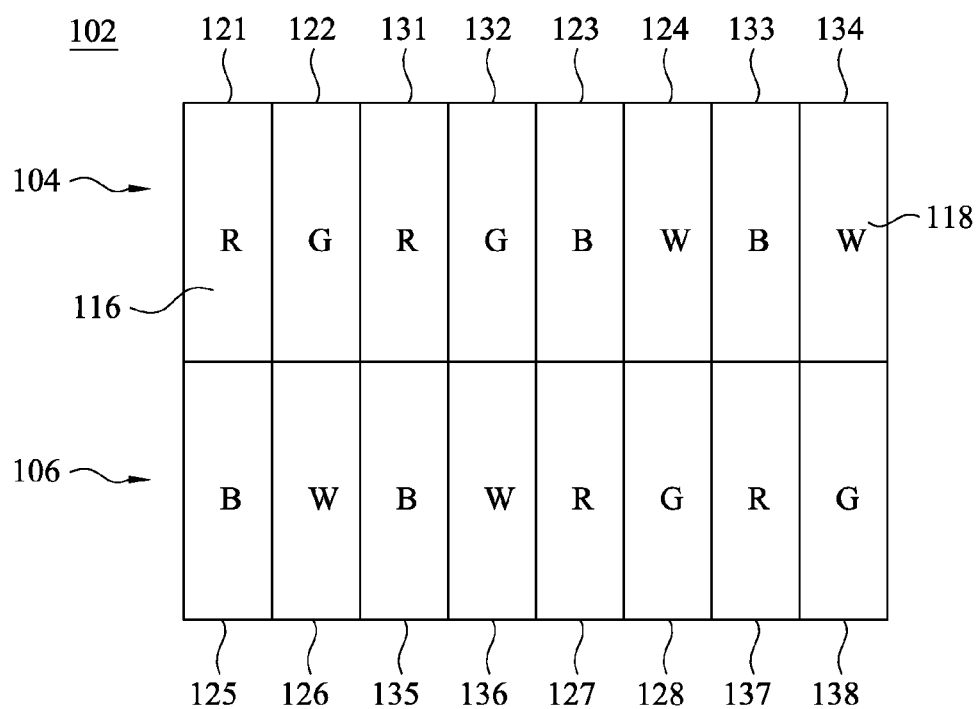
FIG. 8 is a top view of an arrangement of the pixel unit in FIG. 7 according to an embodiment.

FIG. 8 is a top view of an arrangement of the pixel unit in FIG. 7 according to an embodiment. According to the foregoing embodiments, when light transmits through the transparent pixel, the transparent color resist layer 116 determines the color of the transparent pixel. In the present embodiment, reflective color resist layers 118 are disposed respectively on the reflective pixels, and each of the reflective color resist layers 118 determines the color of the corresponding reflective pixel with reflecting ambient light.

According to an embodiment of the present invention, using different colors of the transparent color resist layers 116, the first transparent pixel 121 is red R, the second transparent pixel 122 is green G, the third transparent pixel 123 is blue B, the fourth transparent pixel 124 is white W, the fifth transparent pixel 125 is blue B, the sixth transparent pixel 126 is white W, the seventh transparent pixel 127 is red R, and the eighth transparent pixel 128 is green G.

Using different colors of the reflective color resist layers 118, the first reflective pixel 131 is red R, the second reflective pixel 132 is green G, the third reflective pixel 133 is blue B, the fourth reflective pixel 134 is white W, the fifth reflective pixel 135 is blue B, the sixth reflective pixel 136 is white W, the seventh reflective pixel 137 is red R, and the eighth reflective pixel 138 is green G.

In the present embodiment, the pixel unit 102 includes the transparent color resist layers 116 and the reflective color resist layers 118 with different colors. Therefore, a full-color display image is displayed through a combination of the transparent color resist layers 116 and the reflective color resist layers 118. When outdoor or under high ambient light environments, the reflective pixels display a full-color display image with reflecting ambient light.

However, a person having ordinary skill in the art may choose a suitable color arrangement of the transparent color resist layers 116 and the reflective color resist layers 118 as required. In the present embodiment, the arrangement of the transparent color resist layers 116 and the reflective color resist layers 118 with red R, green G, blue B, and white W color resists may be arranged a variety of different ways.

As in the case of the first embodiment, when the pixel unit 102 of the present embodiment needs to provide a display image, the method for sampling pixels through SPR is applied. Hence, the definition of the sampling areas (see FIG. 4 and FIG. 5) of the first embodiment and the present embodiment are the same, and as a result, a description in this regard will not be repeated.

Figure 9:
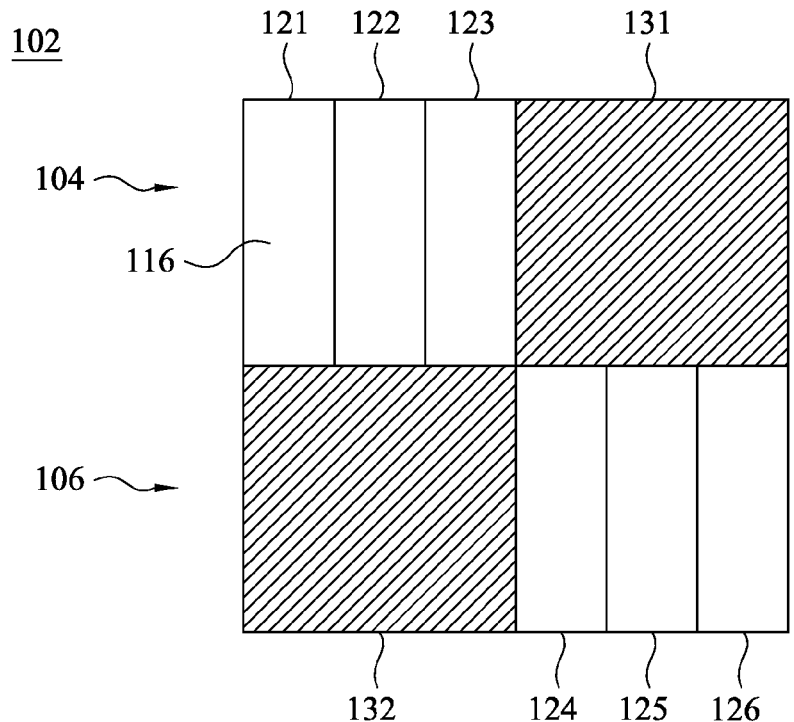
FIG. 9 is a top view of a pixel unit of a pixel matrix according to a fourth embodiment of the present invention.

FIG. 9 is a top view of a pixel unit of a pixel matrix according to a fourth embodiment of the present invention. A pixel unit 102 includes a first row area 104 and a second row area 106 disposed in a side-by-side arrangement.

In an arrangement of the first row area 104, a first transparent pixel 121, a second transparent pixel 122, a third transparent pixel 123, and a first reflective pixel 131 are arranged in sequence from a left side to a right side in the first row area 104.

In an arrangement of the second row area 106, a second reflective pixel 132, a fourth transparent pixel 124, a fifth transparent pixel 125, and a sixth transparent pixel 126 are arranged in sequence from a left side to a right side in the second row area 106.

Each of the above transparent pixels includes a transparent color resist layers 116, and a width of each of the reflective pixels is about triple a width of each of the transparent pixels. Because no color resist layer is disposed on the reflective pixels, the reflective pixels are used for reflecting ambient light and provide a black-and-white (B/W) display image. In the present embodiment, the reflective pixels are sampled through the SPR method, and a description is given below with reference to the drawings.

Figure 10:
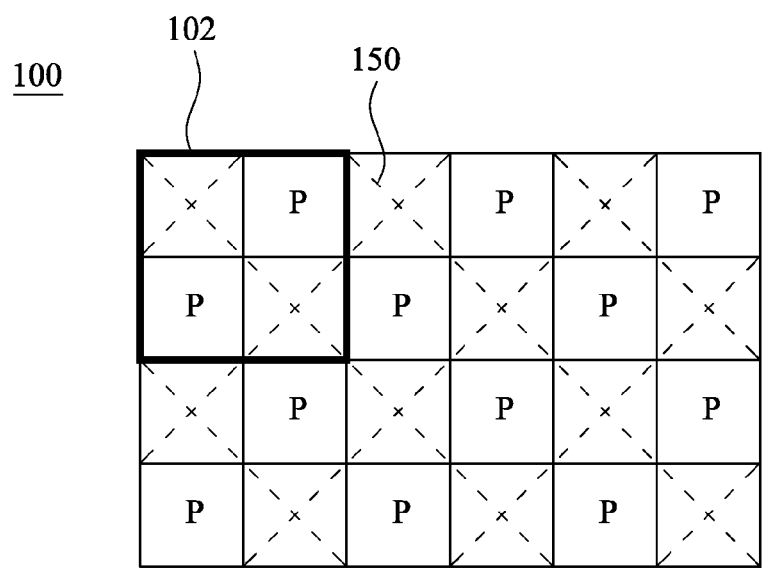
FIG. 10 is a top view of sampling the pixel units in FIG. 9 according to another embodiment.
Figure 11:
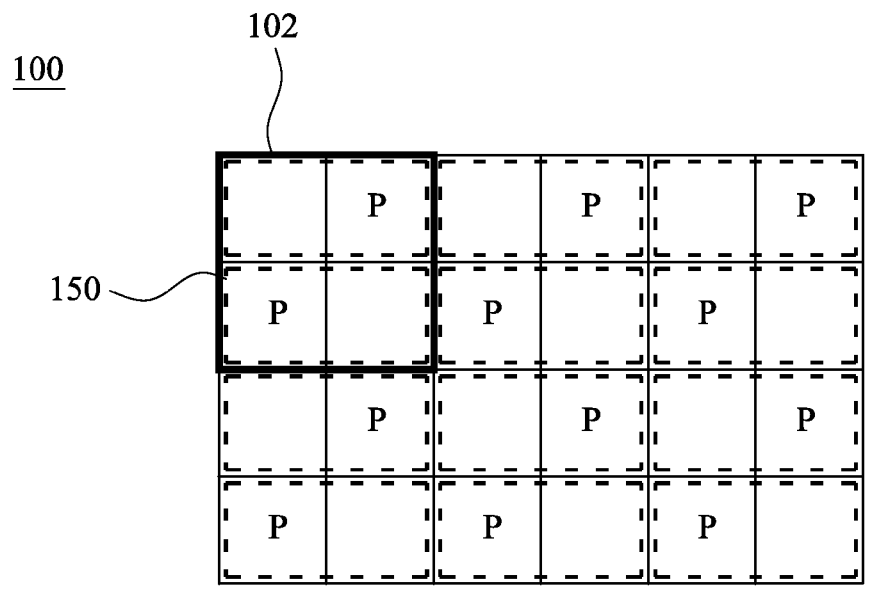
FIG. 11 is a top view of sampling the pixel units in FIG. 9 according to another embodiment.

FIG. 10 is a top view of sampling the pixel units in FIG. 9 according to another embodiment. FIG. 11 is a top view of sampling the pixel units in FIG. 9 according to another embodiment. The pixel matrixes 100 in FIG. 10 and FIG. 11 have the same color arrangement, and the color arrangement is that of the pixel unit 102 shown in FIG. 9.

As an example, the sampling areas 150 in FIG. 10 are diamond-shaped, and the diamond sampling areas 150 can be arranged in a repeating pattern. In addition, each of the sampling areas 150 has one reflective pixel P.

As another example, the sampling areas 150 in FIG. 11 are rectangular, and the rectangular sampling areas 150 can be arranged in a repeating pattern. Similarly, each of the sampling areas 150 has one reflective pixel P inside.

Figure 12:
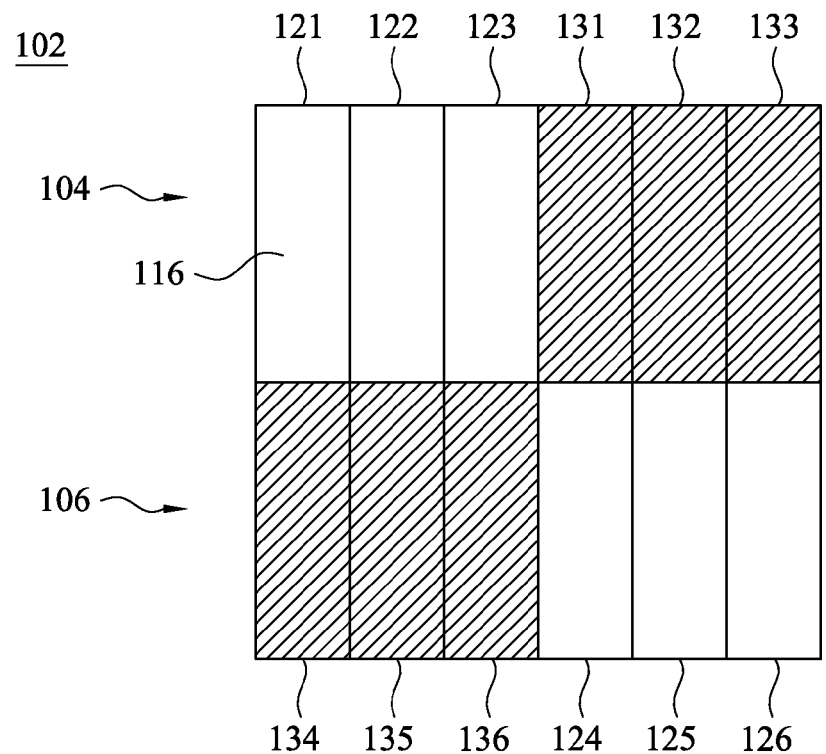
FIG. 12 is a top view of a pixel unit of a pixel matrix according to a fifth embodiment of the present invention.

FIG. 12 is a top view of a pixel unit of a pixel matrix according to a fifth embodiment of the present invention. A pixel unit 102 includes a first row area 104 and a second row area 106 disposed in a side-by-side arrangement.

In an arrangement of the first row area 104, a first transparent pixel 121, a second transparent pixel 122, a third transparent pixel 123, a first reflective pixel 131, a second reflective pixel 132, and a third reflective pixel 133 are arranged in sequence from a left side to a right side in the first row area 104.

In an arrangement of the second row area 106, a fourth reflective pixel 134, a fifth reflective pixel 135, a sixth reflective pixel 136, a fourth transparent pixel 124, a fifth transparent pixel 125, and a sixth transparent pixel 126 are arranged in sequence from a left side to a right side in the second row area 106.

In the present embodiment, the transparent pixels are approximately the same as the transparent pixels of the fourth embodiment, and hence the transparent pixels include the color resist layers 116. The reflective pixels of the present embodiment are defined by dividing the reflective pixels of the second embodiment into three parts, such that the arrangements of the reflective pixels and the transparent pixels are the same. Under such an arrangement, reflective color resist layers are disposed respectively on the reflective pixels, in which the reflective color resist layers are similar to the transparent color resist layer 116. Therefore, the reflective pixels of the pixel unit 102 provide a full-color display image, and further display applications of the pixel matrix 100 of the present invention are possible. An actual application is described below.

Figure 13:
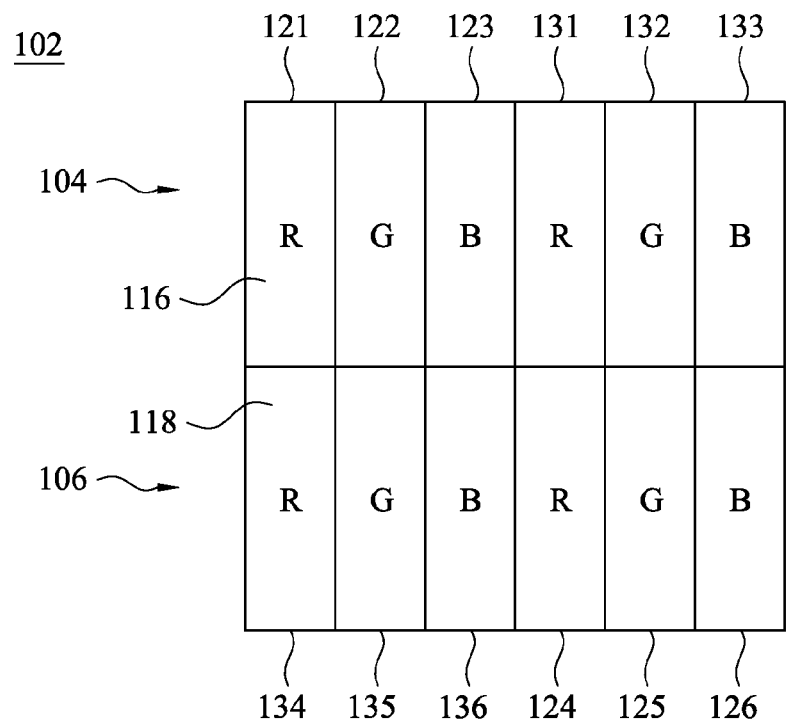
FIG. 13 is a top view of an arrangement of the pixel unit in FIG. 12 according to an embodiment.

FIG. 13 is a top view of an arrangement of the pixel units in FIG. 12 according to an embodiment. According to the foregoing embodiments, when light transmits through the transparent pixel, the transparent color resist layer 116 determines the color of the transparent pixel. In the present embodiment, reflective color resist layers 118 are disposed respectively on the reflective pixels, and each of the reflective color resist layers 118 determines the color of the corresponding reflective pixel with reflecting ambient light.

According to an embodiment of the present invention, using different colors of the transparent color resist layers 116, the first transparent pixel 121 is red R, the second transparent pixel 122 is green G, the third transparent pixel 123 is blue B, the fourth transparent pixel 124 is red R, the fifth transparent pixel 125 is green G, and the sixth transparent pixel 126 is blue B.

Using different colors of the reflective color resist layers 118, the first reflective pixel 131 is red R, the second reflective pixel 132 is green G, the third reflective pixel 133 is blue B, the fourth reflective pixel 134 is red R, the fifth reflective pixel 135 is green G, and the sixth reflective pixel 136 is blue B.

In the present embodiment, the pixel unit 102 includes the transparent color resist layers 116 and the reflective color resist layers 118 with different colors. Therefore, a full-color display image is displayed through a combination of the transparent color resist layers 116 and the reflective color resist layers 118. When outdoors or under high ambient light environments, the reflective pixels display a full-color display image with reflecting ambient light.

However, as with the arrangement of the first embodiment, the arrangement of the transparent color resist layers 116 and the reflective color resist layers 118 with red R, green G, blue B, and white W color resist of the present embodiment may be arranged a variety of different ways.

As in the case of the first embodiment, when the pixel unit 102 of the present embodiment needs to provide a full-color display image, the method for sampling pixels through SPR is applied. Hence, the definition of the sampling areas (see FIG. 4 and FIG. 5) of the first embodiment and the present embodiment are the same, and as a result, a description in this regard will not be repeated.

Figure 14:
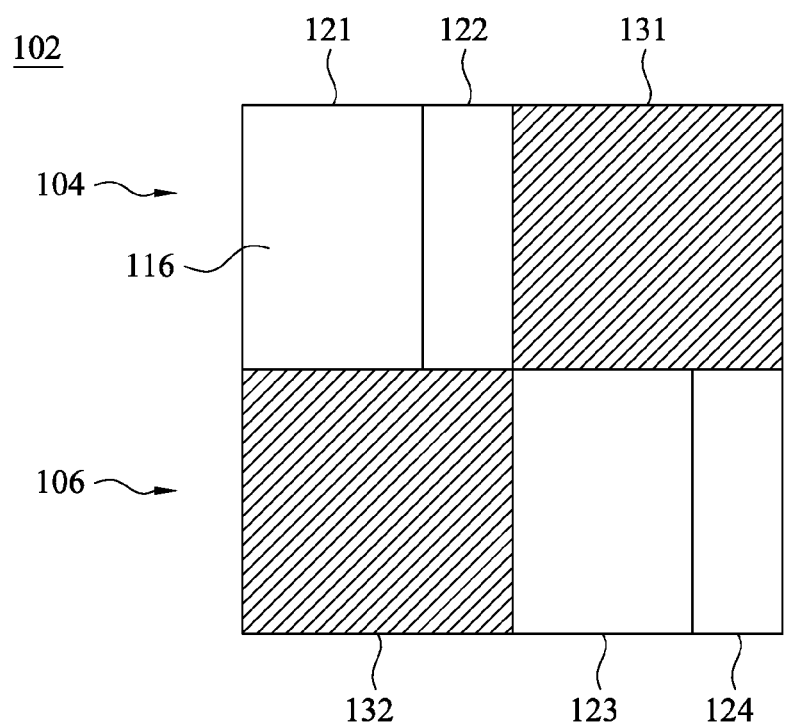
FIG. 14 is a top view of a pixel unit of a pixel matrix according to a sixth embodiment of the present invention.

FIG. 14 is a top view of a pixel unit of a pixel matrix according to a sixth embodiment of the present invention. A pixel unit 102 includes a first row area 104 and a second row area 106 disposed in a side-by-side arrangement.

In an arrangement of the first row area 104, a first transparent pixel 121, a second transparent pixel 122, and a first reflective pixel 131 are arranged in sequence from a left side to a right side in the first row area 104. According to an embodiment, a width of the first reflective pixel 131 and a combined width of the first transparent pixel 121 and the second transparent pixel 122 are the same. Moreover, a width of the first transparent pixel 121 is greater than a width of the second transparent pixel 122.

In an arrangement of the second row area 106, a second reflective pixel 132, a third transparent pixel 123, and a fourth transparent pixel 124 are arranged in sequence from a left side to a right side in the second row area 106. According to an embodiment, a width of the second reflective pixel 132 and a combined width of the third transparent pixel 123 and the fourth transparent pixel 124 are the same. Moreover, a width of the third transparent pixel 123 is greater than a width of the fourth transparent pixel 124.

Figure 15:
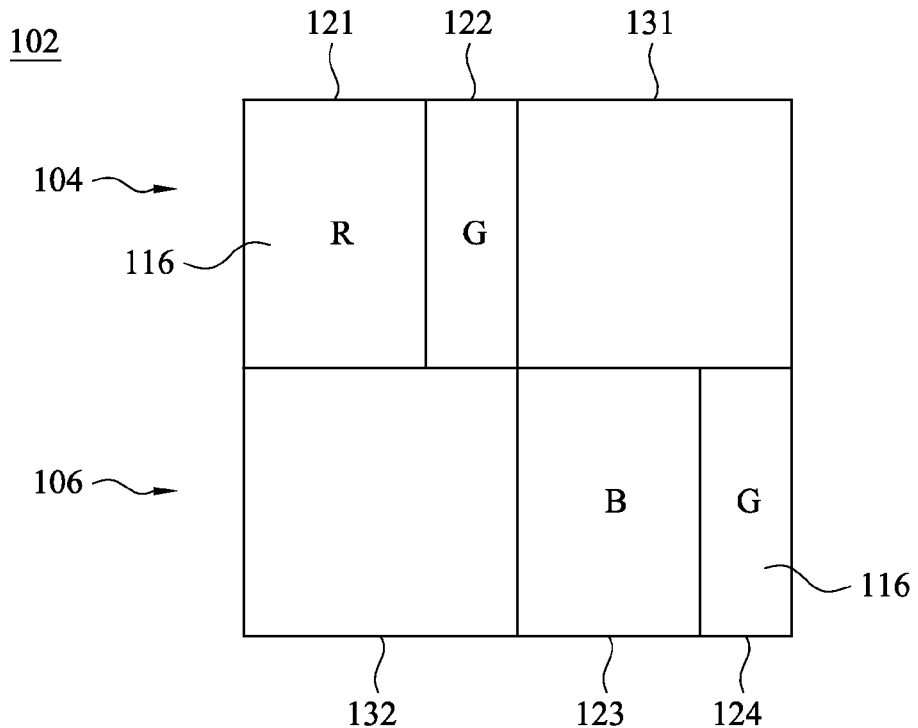
FIG. 15 is a top view of an arrangement of the pixel unit in FIG. 14 according to an embodiment.

FIG. 15 is a top view of an arrangement of the pixel unit in FIG. 14 according to an embodiment. According to the foregoing embodiments, when light transmits through the transparent pixel, the transparent color resist layer 116 determines the color of the transparent pixel. According to an embodiment of the present invention, using different colors of the transparent color resist layers 116, the first transparent pixel 121 is red R, the second transparent pixel 122 is green G, the third transparent pixel 123 is blue B, and the fourth transparent pixel 124 is green G.

In the present embodiment, because human eyes are more sensitive to the color green, the pixel unit 102 includes an arrangement with more than one green G pixel. However, a person having ordinary skill in the art may choose a suitable arrangement of the pixel unit 102.

Figure 16:
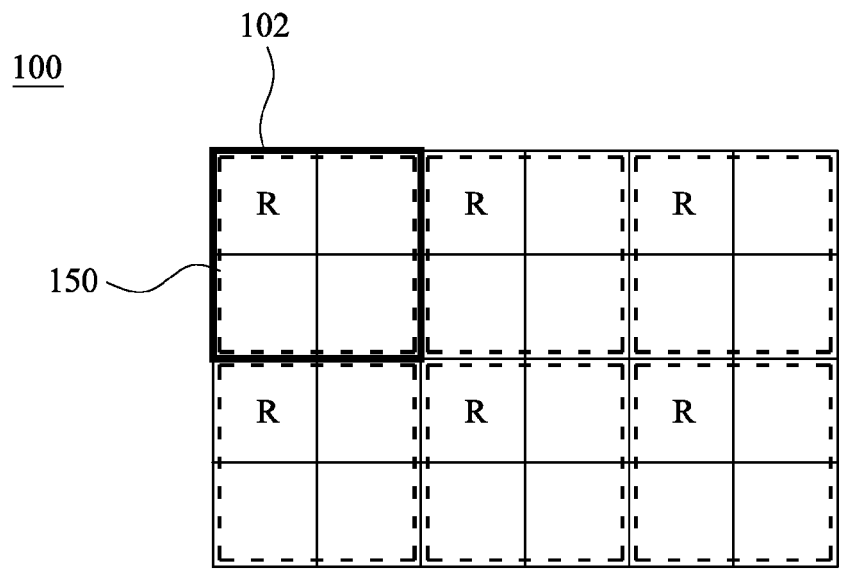
FIG. 16 is a top view of sampling the pixel units in FIG. 15 according to an embodiment.
Figure 17:
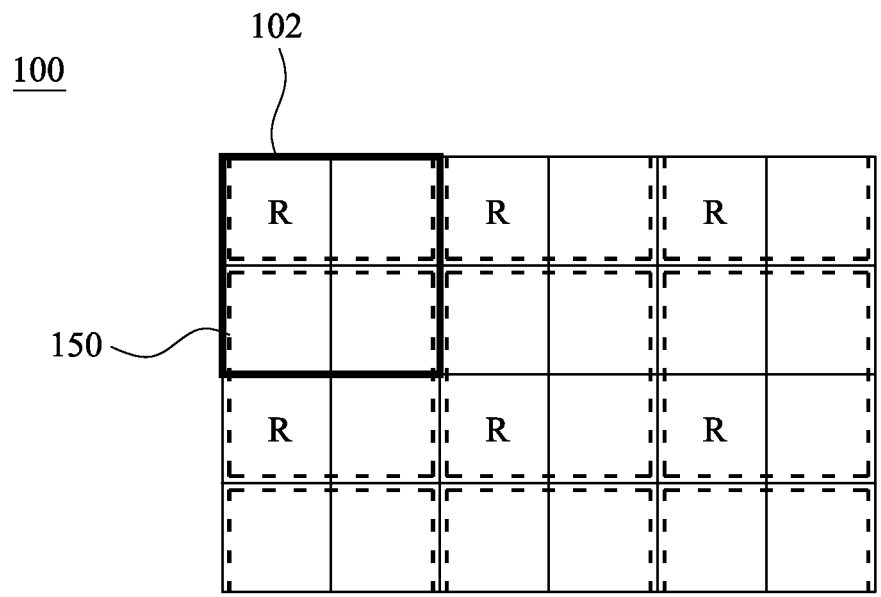
FIG. 17 is a top view of sampling the pixel units in FIG. 15 according to another embodiment.

FIG. 16 is a top view of sampling the pixel units in FIG. 15 according to an embodiment. FIG. 17 is a top view of sampling the pixel units in FIG. 15 according to another embodiment. The pixel matrixes 100 in FIG. 16 and FIG. 17 have the same color arrangement, and the color arrangement is that of the pixel unit 102 shown in FIG. 15.

The pixel matrix 100 of the present invention is sampled through the SPR method. When the pixel matrix 100 needs to provide a red color, the sampling areas 150 which can be arranged in a repeating pattern include the red pixel R. For example, the sampling areas 150 in FIG. 16 are rectangular, and the rectangular sampling areas 150 can be arranged in a repeating pattern. In addition, each of the sampling areas 150 includes one red pixel R.

As shown in FIG. 17, the sampling areas 150 are rectangular and can be arranged in a repeating pattern. Compared with FIG. 16, although the sampling areas 150 in FIG. 17 are shifted a distance half of a pixel unit 102, each of the sampling areas 150 in FIG. 17 includes one red pixel R.

Figure 18:
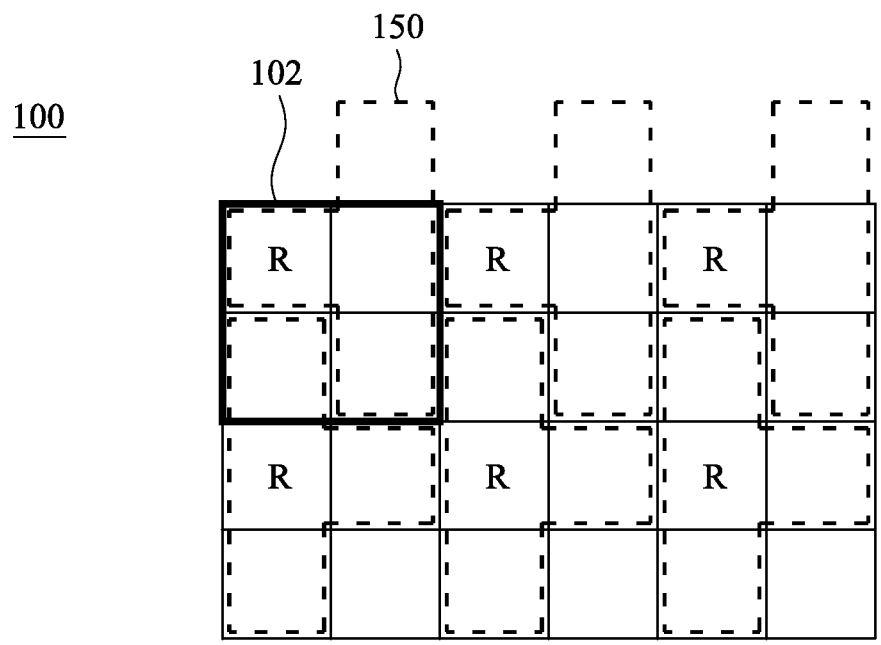
FIG. 18 is a top view of sampling the pixel units in FIG. 15 according to another embodiment.

FIG. 18 is a top view of sampling the pixel units in FIG. 15 according to another embodiment. According to the above descriptions, the shape of the sampling areas 150 has to satisfy two environments. The first condition is that each of the sampling areas 150 has to include a target pixel inside, and the second condition is that the sampling areas 150 can be arranged in a repeating pattern.

In the present embodiment, the arrangement of the pixel unit 102 of the pixel matrix 100 is different from the above embodiments. In particular, the sampling areas 150 in FIG. 18 are convex-shaped. As shown in FIG. 18, when the pixel matrix 100 needs to provide a red color, the red pixels are sampled by the sampling areas 150 with convex forms.

In addition, each of the pixel units 102 of the present embodiment includes two or more green pixels. Therefore, when the pixels unit 102 of the present embodiment needs to provide a green color, the sampling areas 150 may be defined in the same way they are defined in FIG. 4 and FIG. 5.

Figure 19:
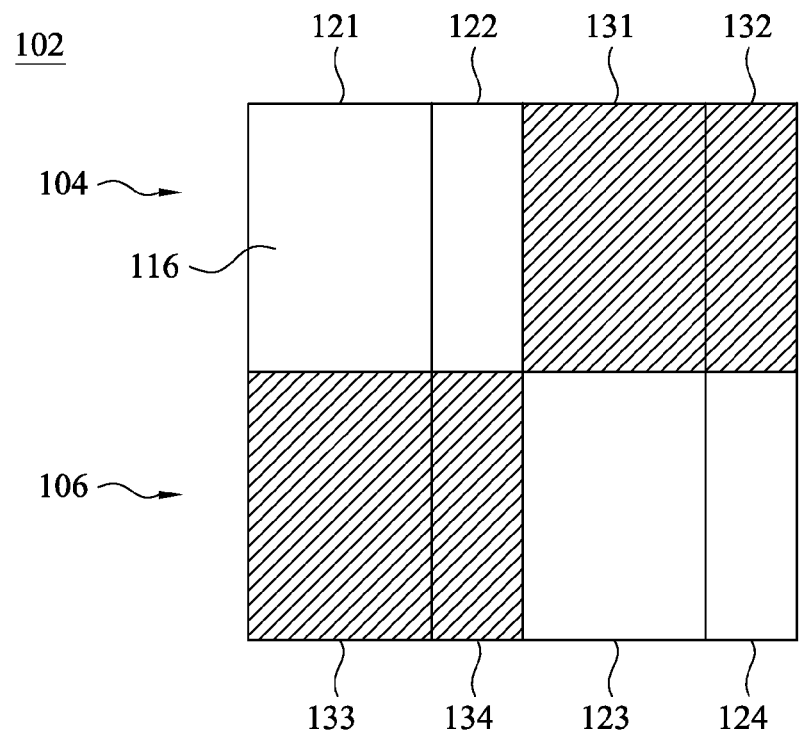
FIG. 19 is a top view of a pixel unit of a pixel matrix according to a seventh embodiment of the present invention.

FIG. 19 is a top view of a pixel unit of a pixel matrix according to a seventh embodiment of the present invention.

A pixel unit 102 includes a first row area 104 and a second row area 106 disposed in a side-by-side arrangement.

In an arrangement of the first row area 104, a first transparent pixel 121, a second transparent pixel 122, a first reflective pixel 131, and a second reflective pixel 132 are arranged in sequence from a left side to a right side in the first row area 104.

In an arrangement of the second row area 106, a third reflective pixel 133, a fourth reflective pixel 134, a third transparent pixel 123, and a fourth transparent pixel 124 are arranged in sequence from a left side to a right side in the second row area 106.

In the present embodiment, the transparent pixels are approximately the same as the transparent pixels of the sixth embodiment, and hence the color resist layers 116 are disposed respectively on the transparent pixels. The reflective pixels of the present embodiment are defined by dividing the reflective pixels of the sixth embodiment into two parts.

The transparent pixels and the reflective pixels are approximately the same. A width of the first reflective pixel 131 is greater than a width of the second reflective pixel 132, and a width of the third reflective pixel 133 is greater than a width of the fourth reflective pixel 134.

Similarly, the reflective color resist layers are further disposed respectively on the reflective pixels which are divided into two parts, such that the pixel matrix of the present invention can have further display applications. An actual application is described below.

Figure 20:
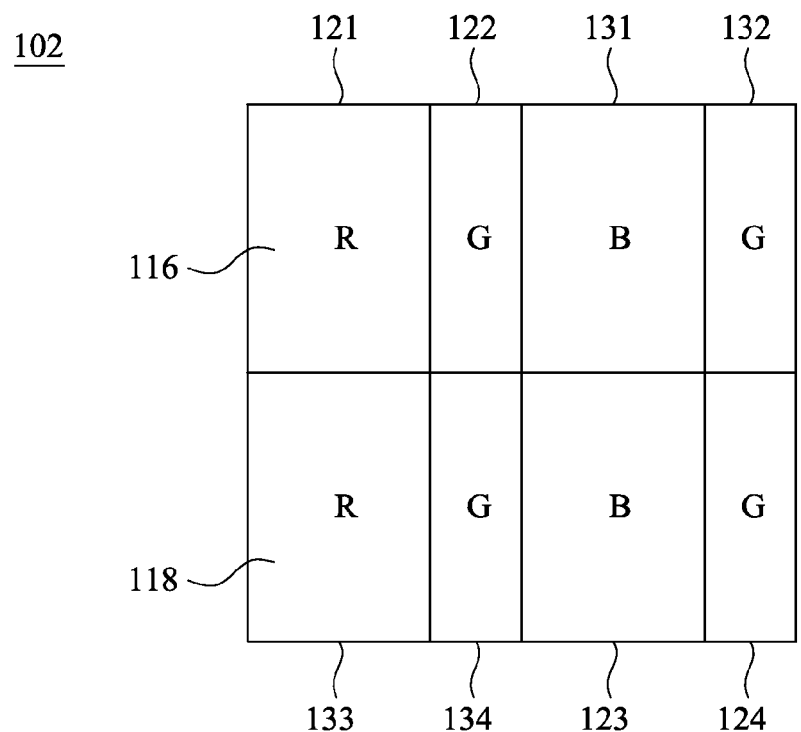
FIG. 20 is a top view of an arrangement of the pixel unit in FIG. 19 according to an embodiment.

FIG. 20 is a top view of an arrangement of the pixel unit in FIG. 19 according to an embodiment. According to the foregoing embodiments, when light transmits through the transparent pixel, the transparent color resist layer 116 determines the color of the transparent pixel. In the present embodiment, reflective color resist layers 118 are disposed respectively on the reflective pixels, and the reflective color resist layers 118 determine the color of the reflective pixels with reflecting ambient light.

According to an embodiment of the present invention, using different colors of the transparent color resist layers 116, the first transparent pixel 121 is red R, the second transparent pixel 122 is green G, the third transparent pixel 123 is blue B, and the fourth transparent pixel 124 is green G.

Using different colors of the reflective color resist layers 118, the first reflective pixel 131 is blue B, the second reflective pixel 132 is green G, the third reflective pixel 133 is red R, and the fourth reflective pixel 134 is green G.

In the present embodiment, the pixel unit 102 includes the transparent color resist layer 116 and the reflective color resist layer 118 with different colors. Therefore, a full-color display image is displayed through a combination of the transparent color resist layers 116 and the reflective color resist layers 118. When used outdoors or under high ambient light environments, the reflective pixels also display a full-color display image with reflecting ambient light.

However, as with the arrangement of the first embodiment, the arrangement of the transparent color resist layers 116 and the reflective color resist layers 118 with red R, green G, blue B, and white W color resists of the present embodiment may be arranged a variety of different ways.

The arrangements of the pixel matrix of the present invention are as described in the foregoing embodiments. In the following embodiments, applications of the pixel matrix in a display are described, and aspects that are the same as in the above embodiments are not described again.

Figure 21:
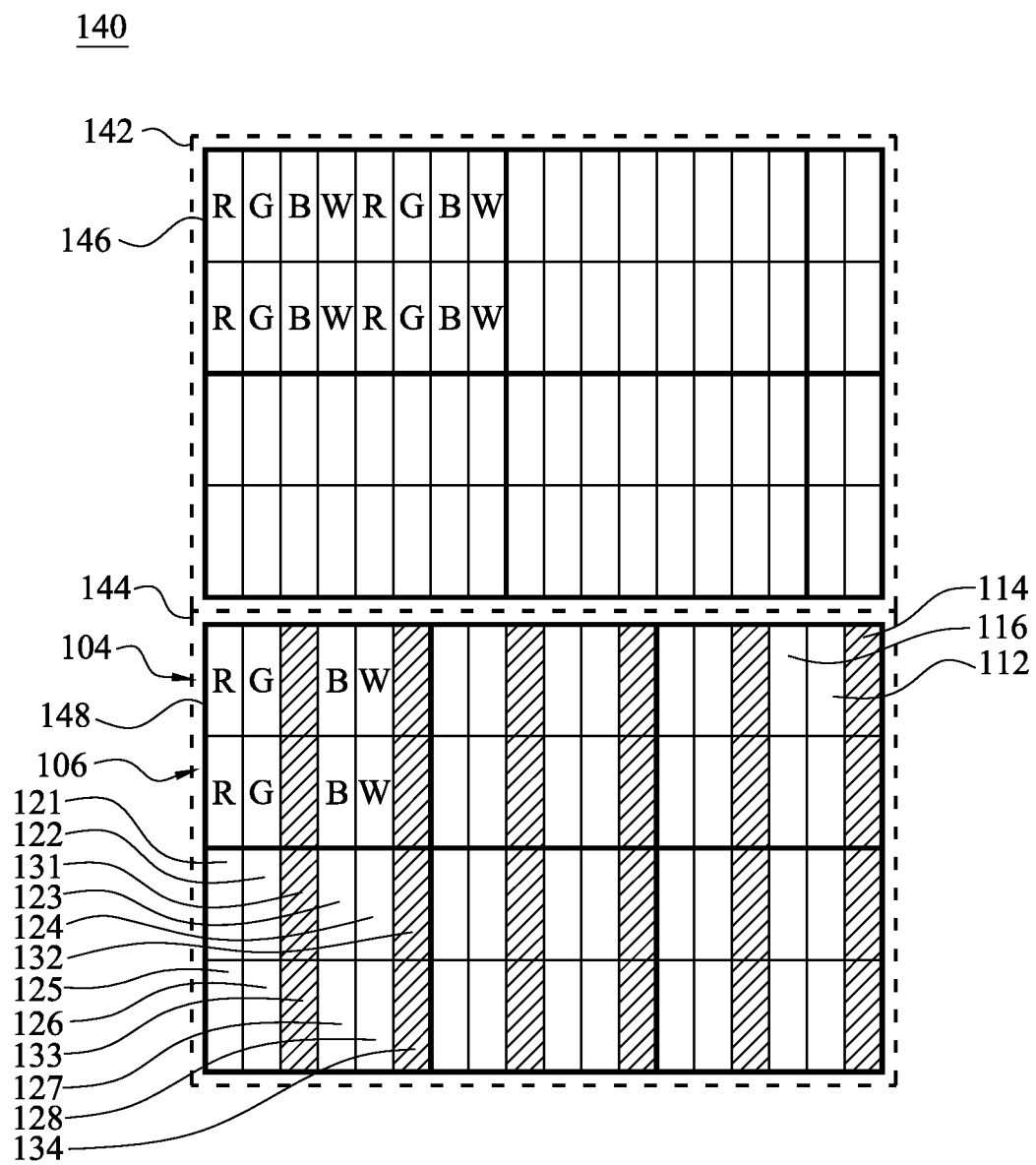
FIG. 21 is a top view of a display according to a first embodiment of the present invention.

FIG. 21 is a top view of a display according to a first embodiment of the present invention. A display area of a display 140 includes a first area 142 and a second area 144, in which the first area 142 and the second area 144 are disposed in a side-by-side arrangement. First main pixels 146 are disposed in the first area 140 in a repeating pattern, and second main pixels 148 are disposed in the second area 142 in a repeating pattern. According to an embodiment, an area of the first area 144 is greater than an area of the second area 146, in which a ratio of the first area 144 to the second area 146 is between about 1 and 15.

Each of the first main pixel 146 includes color pixels, and the color pixels are arranged as shown in FIG. 21 with red R, green G, blue B, and white W pixels. A person having ordinary skill in the art may choose a proper arrangement of the color pixels as required.

Each of the second main pixels 148 includes a first row area 104 and a second row area 106 disposed in a side-by-side arrangement. In an arrangement of the first row area 104, a first transparent pixel 121, a second transparent pixel 122, a first reflective pixel 131, a third transparent pixel 123, a fourth transparent pixel 124, and a second reflective pixel 132 are arranged in sequence from a left side to a right side in the first row area 104. In an arrangement of the second row area 106, a fifth transparent pixel 125, a sixth transparent pixel 126, a third reflective pixel 133, a seventh transparent pixel 127, an eighth transparent pixel 128, and a fourth reflective pixel 134 are arranged in sequence from a left side to a right side in the second row area 106. Each of the transparent pixels includes a transparent electrode 112 and a transparent color resist layer 116 disposed on the transparent electrode 112.

Switch components (not illustrated) are connected to the transparent electrodes 112 of the transparent pixels and the reflective electrodes 114 of the reflective pixels respectively for driving the transparent pixels and the reflective pixels individually.

In the present embodiment, when a user uses the display 140 indoors or under low ambient light environments, the color pixels of the first main pixel 146 and the transparent pixels of the second main pixels 148 provide a full-color display image.

When the user uses the display 140 outdoors or under high ambient light environments, the reflective pixels of the second main pixels 148 provide a black-and-white (B/W) display image.

When there is a change between the above two environments, the transparent pixels and the reflective pixels are individually controlled through the switch components, and the image provided by the transparent pixels and reflective pixels are not affected by each other. Therefore, displaying an accurate color image is achieved.

Furthermore, when a user uses the display 140 indoors or under low ambient light environments, the display 140 provides a full-color display image for the user. For example, the user can browse photos, the weather, maps or web pages through the display 140. When a user uses the display 140 outdoors or under high ambient light environments, the display 140 provides a black-and-white (B/W) display image for the user. For example, the user can view electronic clock information, numbers, or name information through the display 140.

The display 140 provides the user with a display image with great visibility when used outdoors. Moreover, when the user needs to browse information outdoors, the display 140 provides display images by the reflective pixels such that an effect of saving energy is achieved.

Figure 22:
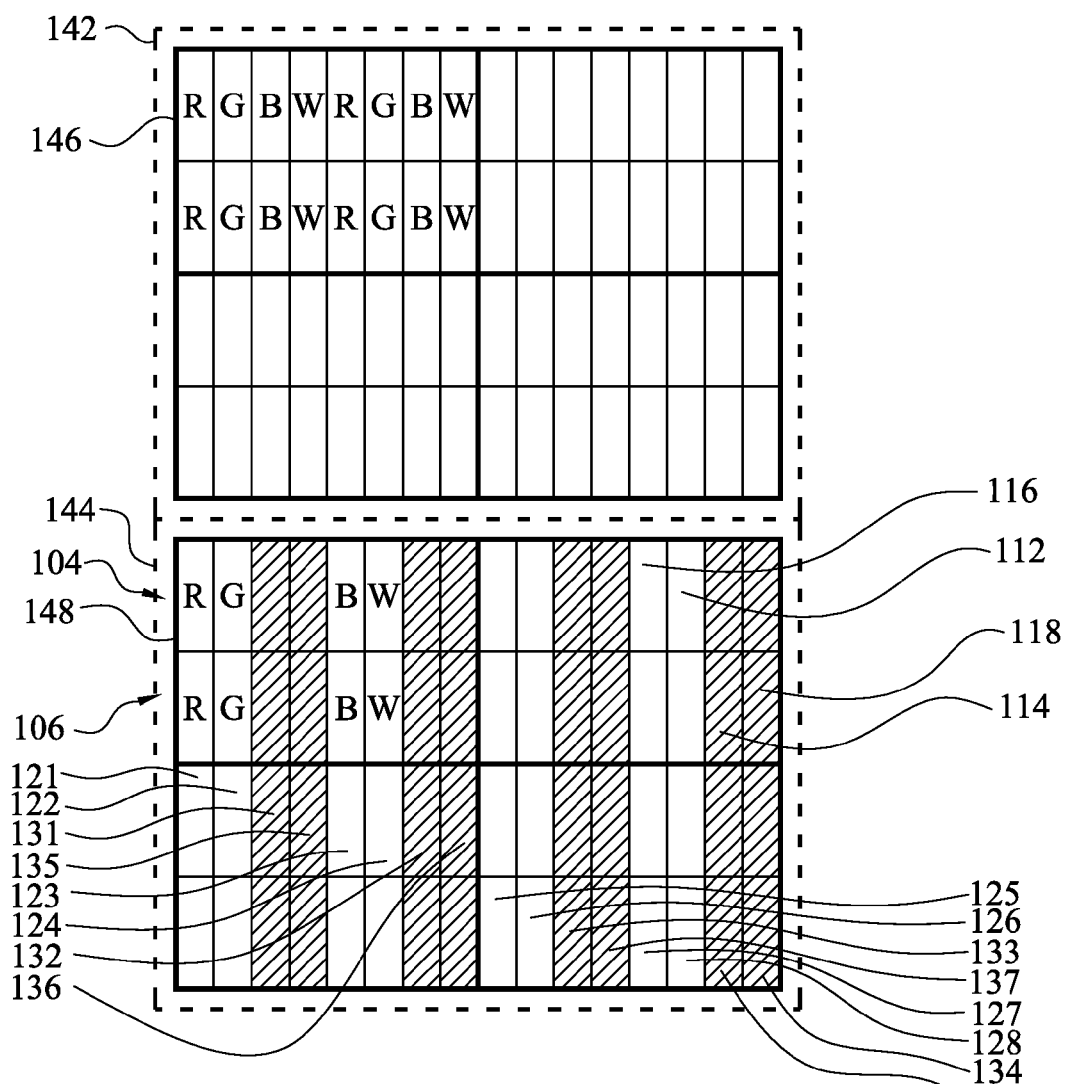
FIG. 22 is a top view of a display according to a second embodiment of the present invention.

FIG. 22 is a top view of a display according to a second embodiment of the present invention. The difference between this embodiment and the first embodiment is that the second main pixel 148 includes a fifth reflective pixel 135, a sixth reflective pixel 136, a seventh reflective pixel 137, an eighth reflective pixel 138, and reflective color resist layers 118.

The fifth reflective pixel 135 is disposed in the first row area 104, and the fifth reflective pixel 135 is located between the first reflective pixel 131 and the third transparent pixel 123. The sixth reflective pixel 136 is disposed in the first row area 104, and the sixth reflective pixel 136 is located at a side of the second reflective pixel 132 and opposite the fourth transparent pixel 124. The seventh reflective pixel 137 is disposed in the second row area 106, and the seventh reflective pixel 137 is located between the third reflective pixel 133 and the seventh transparent pixel 127. The eighth reflective pixel 137 is disposed in the second row area 106, and the eighth reflective pixel 128 is located at a side of the fourth reflective pixel 134 and opposite the eighth transparent pixel 128. The reflective color resist layers 118 are disposed respectively on the reflective pixels.

In the application of the display 140 of the present embodiment, when the user uses the display 140 indoors or under low ambient light environments, the display 140 provides the user with a full-color display image for browsing. When the user uses the display 140 outdoors or under high ambient light environments, the display 140 still provides the user with a full-color display image.

The above displays 140 are the applications of the pixel matrix 100. According to additional embodiments of the present invention, reference can be made to the pixel units 102 of the above embodiment for the arrangement of the second main pixel 148 in the second area 144 of the display 140. In other words, the arrangements of the pixel units 102 of above embodiments can be applied to the second main pixel 148 of the display 140.

An aspect of the present invention provides a pixel matrix including pixel units. The pixel units are arranged in a repeating pattern and include transparent pixels, reflective pixels, and switch components. Each of the transparent pixels includes a transparent electrode and a transparent color resist layer disposed on the transparent electrode. Each of the reflective pixels includes a reflective electrode. The switch components are connected to the transparent electrodes of the transparent pixels and the reflective electrodes of the reflective pixels respectively for driving the transparent pixels and the reflective pixels individually.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A pixel matrix comprising a plurality of pixel units arranged in a repeating pattern, wherein each of the pixel units comprises:

a plurality of transparent pixels, wherein each of the transparent pixels comprises a transparent electrode and a transparent color resist layer disposed on the transparent electrode;

a plurality of reflective pixels, wherein each of the reflective pixels comprises a reflective electrode; and a plurality of switch components connected to the transparent electrodes of the transparent pixels and the reflective electrodes of the reflective pixels respectively for driving the transparent pixels and the reflective pixels individually; and a first row area and a second row area disposed in a side-by-side arrangement, wherein a first transparent pixel, a second transparent pixel, a first reflective pixel, a third transparent pixel, a fourth transparent pixel, and a second reflective pixel are arranged in sequence from a left side to a right side in the first row area, and a fifth transparent pixel, a sixth transparent pixel, a third reflective pixel, a seventh transparent pixel, an eighth transparent pixel, and a fourth reflective pixel are arranged in sequence from a left side to a right side in the second row area.

2. The pixel matrix of claim 1, wherein the transparent electrodes have a first operating voltage, and the reflective electrodes have a second operating voltage which is different from the first operating voltage.

3. A pixel matrix comprising a plurality of pixel units arranged in a repeating pattern, wherein each of the pixel units comprises:

a plurality of transparent pixels, wherein each of the transparent pixels comprises a transparent electrode and a transparent color resist layer disposed on the transparent electrode;

a plurality of reflective pixels, wherein each of the reflective pixels comprises a reflective electrode; and a plurality of switch components connected to the transparent electrodes of the transparent pixels and the reflective electrodes of the reflective pixels respectively for driving the transparent pixels and the reflective pixels individually, wherein an image signal of the pixel matrix comprises a color signal and a gray signal, and the color signal comprises a red signal, a green signal, and a blue signal, wherein the gray signal is defined by dividing a superimposition of the red signal, the green signal, and the blue signal by three.

4. A display, comprising:

a first area;

a plurality of first main pixels disposed in the first area in a repeating pattern;

a second area disposed in a side-by-side arrangement with the first area; and a plurality of second main pixels disposed in the second area in a repeating pattern, wherein each of the second main pixels comprises:

a first row area, and a first transparent pixel, a second transparent pixel, a first reflective pixel, a third transparent pixel, a fourth transparent pixel, and a second reflective pixel are arranged in sequence from a left side to a right side in the first row area; and a second row area disposed in a side-by-side arrangement with the first row area, and a fifth transparent pixel, a sixth transparent pixel, a third reflective pixel, a seventh transparent pixel, an eighth transparent pixel, and a fourth reflective pixel are arranged in sequence from a left side to a right side in the second row area, wherein each of the transparent pixels comprises a transparent electrode and a transparent color resist layer disposed on the transparent electrode.

5. The display of claim 4, wherein a ratio of the first area to the second area is between about 1 and 15.

* * * * *